(12) United States Patent  (10) Patent No.: US 7,535,003 B2
Honda et al.  (45) Date of Patent: May 19, 2009

(54) SOLID-STATE IMAGING DEVICE AND DRIVING METHOD THEREOF

(75) Inventors: Hiroto Honda, Tokyo (JP); Yoshinori Iida, Tokyo (JP); Ikuo Fujiwara, Yokohama (JP); Naru Ikeda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/050,572

(22) Filed: Mar. 18, 2008

(65) Prior Publication Data

US 2008/0237468 A1   Oct. 2, 2008

(30) Foreign Application Priority Data

Mar. 27, 2007   (JP) .............................. 2007-082653

(51) Int. Cl.
  *H01L 31/00*  (2006.01)
(52) U.S. Cl. .................. 250/338.4; 250/338.1; 250/330
(58) Field of Classification Search .............. 250/338.4, 250/338.1, 330
  See application file for complete search history.

(56) References Cited

U.S. PATENT DOCUMENTS 7,026,617 B2    4/2006  Mashio et al.
7,345,278 B2    3/2008  Honda et al.
2003/0062480 A1*  4/2003  Kanzaki ................... 250/338.1
2007/0170363 A1*  7/2007  Schimert et al. ............ 250/353

FOREIGN PATENT DOCUMENTS

JP          3616622        11/2004

OTHER PUBLICATIONS

Tomohiro Ishikawa et al.,"Low-cost 320×240 uncooled IRFPA using conventional silicon IC process", SPIE vol. 3698, Apr. 1999, pp. 556-564.

* cited by examiner

*Primary Examiner*—David P Porta
*Assistant Examiner*—Djura Malevic
(74) *Attorney, Agent, or Firm*—Oblon, Spivak, McClelland, Maier & Neustadt, P.C.

(57) ABSTRACT

This disclosure concerns a solid-state imaging device including a pixel thermally separated from a substrate; a heat conduction switch having one end connected to the substrate and other end capable of contacting to the substrate or the pixel, the heat conduction switch changing over a state of the pixel to one of a first state and a second state, the first state being a state in which the pixel is thermally isolated from the substrate by causing the other end of the heat conduction switch to contact with the substrate, the second state being a state in which the pixel is thermally shorted to the substrate by causing the other end of the heat conduction switch to contact with the pixel; and a signal detector detecting a difference between the signal voltage of the pixel in the first state and the signal voltage of the pixel in the second state.

18 Claims, 14 Drawing Sheets

7 (SIGNAL DETECTOR)

11 (HORIZONTAL READ CIRCUIT)

SOLID-STATE IMAGING DEVICE AND DRIVING METHOD THEREOF

CROSS-REFERENCE TO RELATED APPLICATION

This application is based upon and claims the benefit of priority from the prior Japanese Patent Application No. 2007-82653, filed on Mar. 27, 2007, the entire contents of which are incorporated herein by reference.

BACKGROUND OF THE INVENTION

1. Field of the Invention

The present invention relates to a solid-state imaging device and driving a solid-state imaging device, for example, a uncooled-type solid-state imaging element detecting a light having a long wave length.

2. Related Art

An image sensor detecting a light ray in bands of wavelengths of 8 to 12 micrometers (μm) including an infrared band, a terahertz band, a millimeter-wave band, and the like has high sensitivity to a light ray emitted from an object having a temperature near room temperature. Accordingly, such an image sensor has been applied to a security camera, an on-vehicle forward-looking camera or the like. In recent years, following development of MEMS (Micro-Electro-Mechanical System) process, a thermal-type optical sensor (a uncooled-type optical sensor) sensing a light ray without cooling an element has become popular as an image sensor.

The uncooled-type optical sensor irradiates a light ray condensed by, for example, a far-infrared lens (Ge lens) onto each of pixels and converts heat generated by the light ray into an electric signal. The uncooled-type optical sensor generates an image based on the generated electric signal. The uncooled-type optical sensor of this type needs to detect the light ray in a state in which the pixels are thermally separated from a semiconductor substrate. Because each of the pixels is continuously heated by the light ray, it is difficult for the conventional uncooled-type optical sensor to detect an electric signal in a dark state (a state in which light is not incident on each pixel). A signal voltage obtained by the thermoelectric conversion is low as compared with a voltage of the electric signal (i.e., a bias component) in the dark state. However, in the uncooled-type sensor, bias components cannot be eliminated from the respective pixels for the above-stated reason. Due to this, at the time of starting the sensor with the lens covered with a lens cover, the signal in the dark state (a fixed pattern) output from each pixel is stored in a frame memory in advance. Thereafter, the fixed pattern is subtracted from the detected electric signal corresponding to each pixel, thereby outputting signal components corresponding to an incident light.

In this case, however, it is necessary to additionally provide a circuit for subtracting the fixed pattern from each electric signal, disadvantageously resulting in an increase in a size of the sensor. Furthermore, if the fixed pattern has temporal change, then an initial fixed pattern cannot be used and it is disadvantageously necessary to regularly update the fixed pattern.

JP-A 2004-085331 (KOKAI) discloses a thermal-type infrared image pickup device provided with including a mechanical switch so as to be able to quickly respond to an infrared ray. This mechanical switch causes rapid thermal conduction between a cell part and a semiconductor substrate in a period in which no electric signals are detected from respective pixels, and thermally separates the cell part from the semiconductor substrate in a signal detection period. The thermal-type infrared imaging device disclosed therein can, therefore, pick up an image at high speed. However, the thermal-type infrared imaging device disclosed therein is unable to read signals output from the respective pixels in a state in which the cell part is shorted to the semiconductor substrate, that is, in a thermally reset state. As a result, 1/f noise and irregularities in fixed pattern among the pixels cannot be eliminated.

SUMMARY OF THE INVENTION

A solid-state imaging device according to an embodiment of the present invention comprises a semiconductor substrate; a pixel converting a heat energy generated by an incident light into an electric signal, the pixel being supported on a cavity formed in the semiconductor substrate and being thermally separated from the semiconductor substrate; a heat conduction switch having one end connected to the semiconductor substrate and other end capable of contacting to the semiconductor substrate or the pixel, the heat conduction switch changing over a state of the pixel to one of a first state and a second state, the first state being a state in which the pixel is thermally isolated from the semiconductor substrate by causing the other end of the heat conduction switch to contact with the semiconductor substrate, the second state being a state in which the pixel is thermally shorted to the semiconductor substrate by causing the other end of the heat conduction switch to contact with the pixel; and a signal detector detecting a difference between the signal voltage of the pixel in the first state and the signal voltage of the pixel in the second state.

A method of driving a solid-state imaging device according to an embodiment of the present invention, the device including a semiconductor substrate; a pixel converting a heat energy generated by an incident light into an electric signal, the pixel being supported on a cavity formed in the semiconductor substrate and thermally separated from the semiconductor substrate; a signal line transmitting a signal voltage output from the pixel; a heat conduction switch having one end connected to the semiconductor substrate and other end capable of contacting to the semiconductor substrate or the pixel; and a signal detector capacitively coupled to the signal line, the method comprises detecting a difference between the signal voltage of the pixel in a first state and the signal voltage of the pixel in a second state, the first state being a state in which the pixel is thermally isolated from the semiconductor substrate by causing the other end of the heat conduction switch to contact with the semiconductor substrate, the second state being a state in which the pixel is thermally shorted to the semiconductor substrate by causing the other end of the heat conduction switch to contact with the pixel.

DETAILED DESCRIPTION OF THE INVENTION

Embodiments of the present invention will be explained below with reference to the accompanying drawings. The present invention is not limited to the embodiments.

First Embodiment

Figure 1:
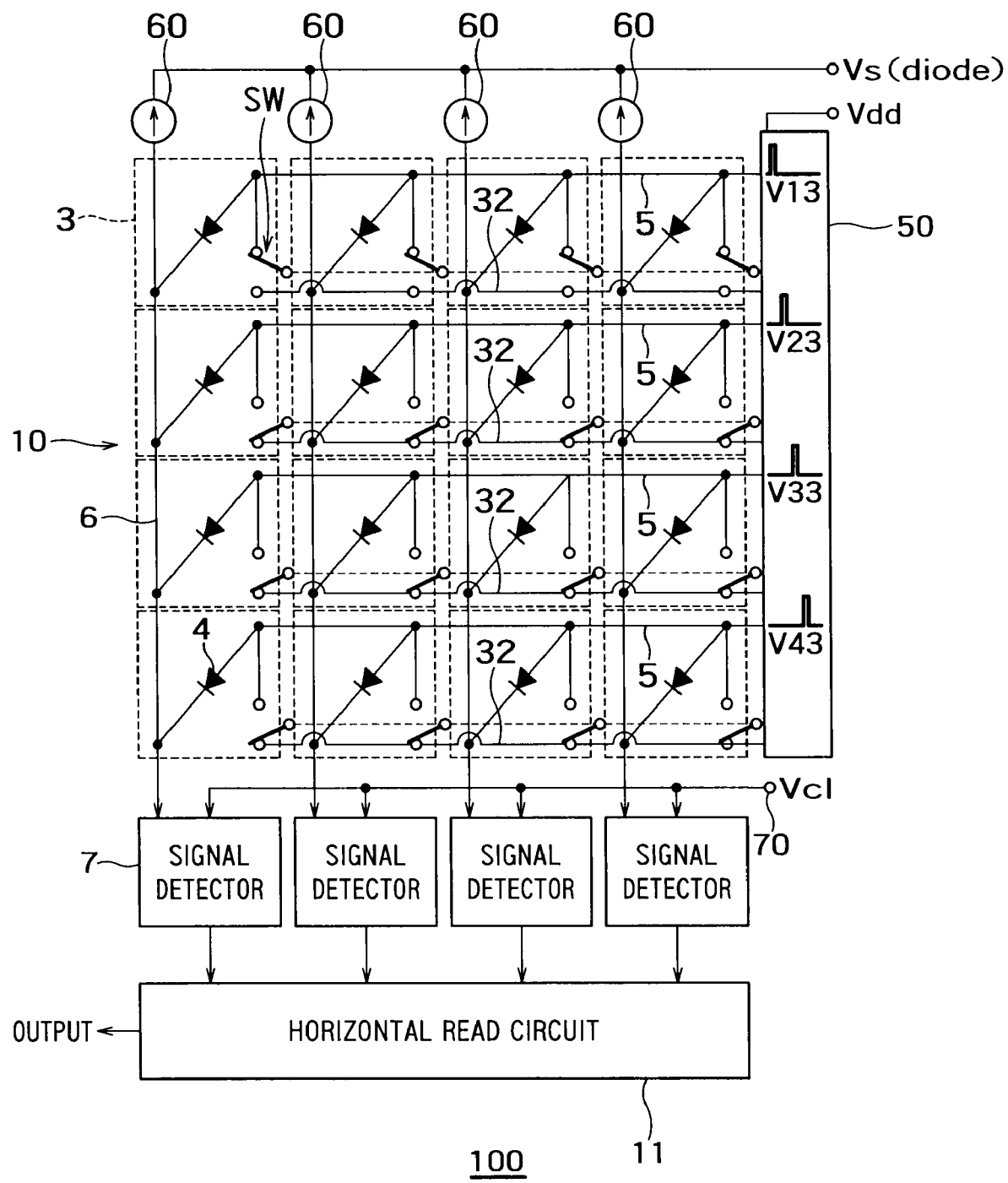
FIG. 1 is a schematic diagram of a thermal-type sensor 100 according to a first embodiment.

A thermal-type sensor 100 (hereinafter, "sensor 100") shown in FIG. 1 is, for example, a long-wavelength sensor such as an infrared sensor, a terahertz sensor or a millimeter-wave sensor. The infrared sensor 100 is provided with an imaging region 10 that includes 16 pixels 3 arranged in a matrix (four rows by four columns) on a semiconductor substrate. Although the imaging region 10 generally includes more pixels, the number of pixels is set to 16 for the sake of convenience in the first embodiment. Each of the pixels 3 in the imaging region 10 includes a pn junction (diode) 4. Each pixel 3 converts heat energy generated by an incident light into an electric signal. More specifically, a signal is read by applying forward current to the pn junction 4 and reading a voltage according to an operating point that changes by a temperature of the pn junction 4.

Generally, while the temperature change of the pn junction 4 depends on absorptance of an infrared absorbing layer or an optical system, the temperature change of the pn junction 4 is about $5 \times 10^{-3}$ of that of an object. Namely, if the temperature of the object changes by 1 Kelvin (K), a pixel temperature changes by 5 millikelvins (mK). If eight silicon pn junctions are connected in series, thermoelectric conversion efficiency is about 10 mV/K. Therefore, if the temperature of the object changes by 1 K, a signal voltage of 50 microvolts (µV) is generated in each pixel 3. Actually, it is often required to discriminate the temperature change of about 0.1 K of the object. To meet the requirement, the sensor 100 needs to read a signal voltage as low as, for example, 5 µV generated in each pixel 3.

Row selection lines 5 are connected to the pixels 3 arranged in a row direction. Vertical signal lines (hereinafter, also "signal lines") 6 are connected to the pixels 3 arranged in a column direction. Each of the row selection lines 5 is connected to one end (an anode side) of the pn junction 4 of each pixel 3 whereas each of the signal lines 6 is connected to the other end (a cathode side) thereof.

The row selection lines 5 are connected to a vertical scanner 50. The vertical scanner 50 applies a pulse voltage to a selected row selection line 5. The signal lines 6 are provided to correspond to the respective pixel columns, and each of the signal lines 6 is connected between the pixels 3 arranged in the column direction and each of constant current sources 60. The constant current sources 60 are configured to apply a constant current to the respective pixels 3 in the imaging region 10. When the vertical scanner 50 applies a pulse voltage to the pn junctions 4 in a selected row, the pn junctions 4 in the selected row are biased in forward direction. As a result, a column voltage Vsl is generated on the signal lines 6. On the other hand, the pn junctions 4 in unselected rows are all biased in reverse direction, so that the unselected row selection lines 5 are separated from the signal lines 6.

Heat conduction switches SW are provided to correspond to the respective pixels 3. The heat conduction switches SW are configured to be able to contact with either the semiconductor substrate or the corresponding pixels 3. By causing the heat conduction switches SW to contact with the semiconductor substrate, the imaging region 10 turns into a first state in which the imaging region 10 is thermally isolated from the semiconductor substrate. By causing the heat conduction switches SW to contact with the pn junctions 4, the imaging region 10 turns into a second state in which the pn junctions 4 are thermally shorted to the semiconductor substrate. The heat conduction switches SW can selectively change over the state of the imaging region 10 between the first state and the second state.

Signal detectors 7 are provided to correspond to the respective signal lines 6. The signal detectors 7 have an input 70 for performing a clamping operation, and start the clamping operation in response to a clamp pulse. Each of the signal detectors 7 detects the column voltage Vsl transmitted from the corresponding signal line 6. Each of the signal lines 6 functions to transmit the signal voltage generated in the pixels 3 to the corresponding signal detector 7.

The signal detectors 7 are connected to a horizontal read circuit 11. The horizontal read circuit 11 sequentially outputs signals detected by the signal detectors 7 to an outside of the sensor 100.

Figure 2:
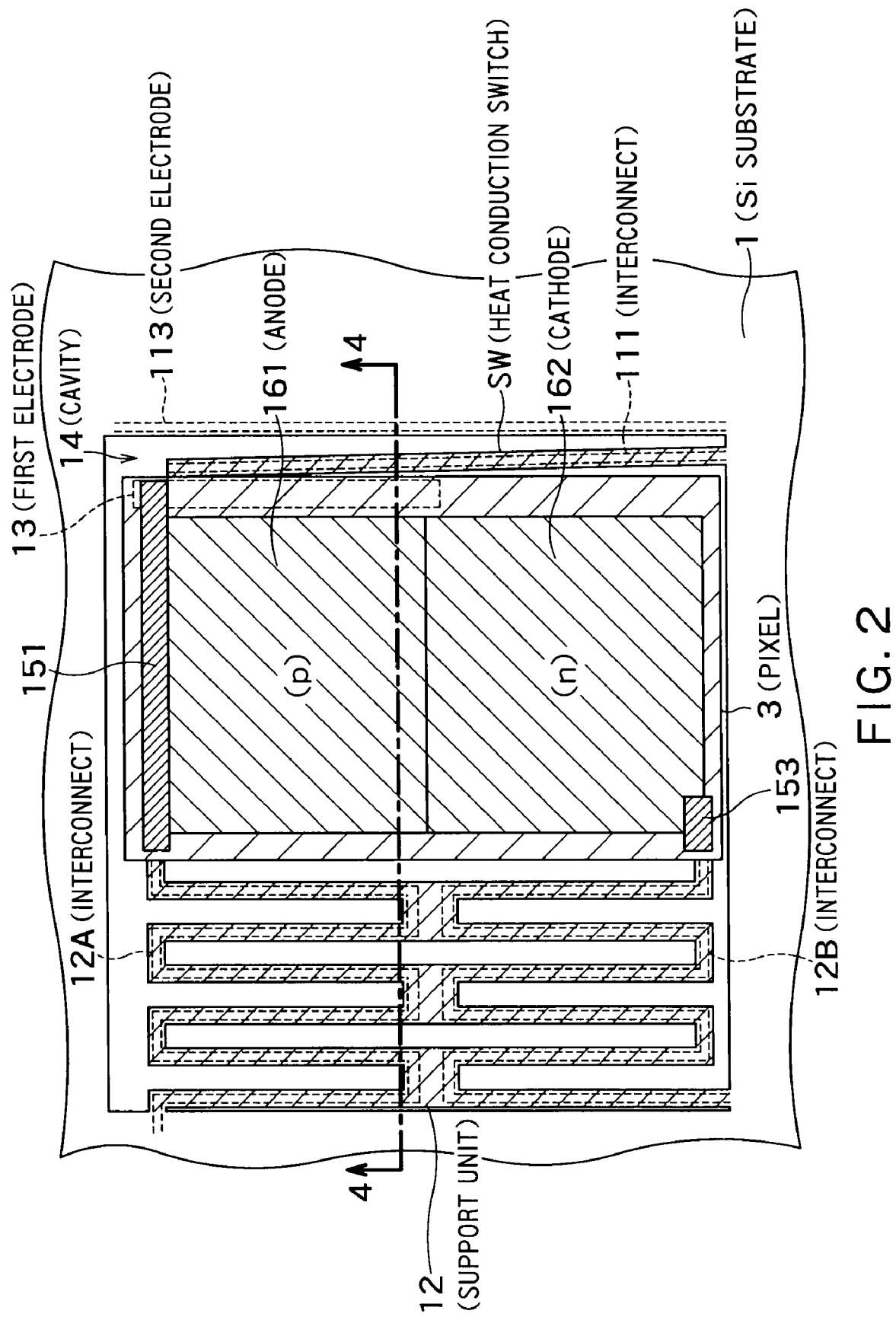
FIG. 2 is a plane view of the pixel 3 in a first state.
Figure 4:
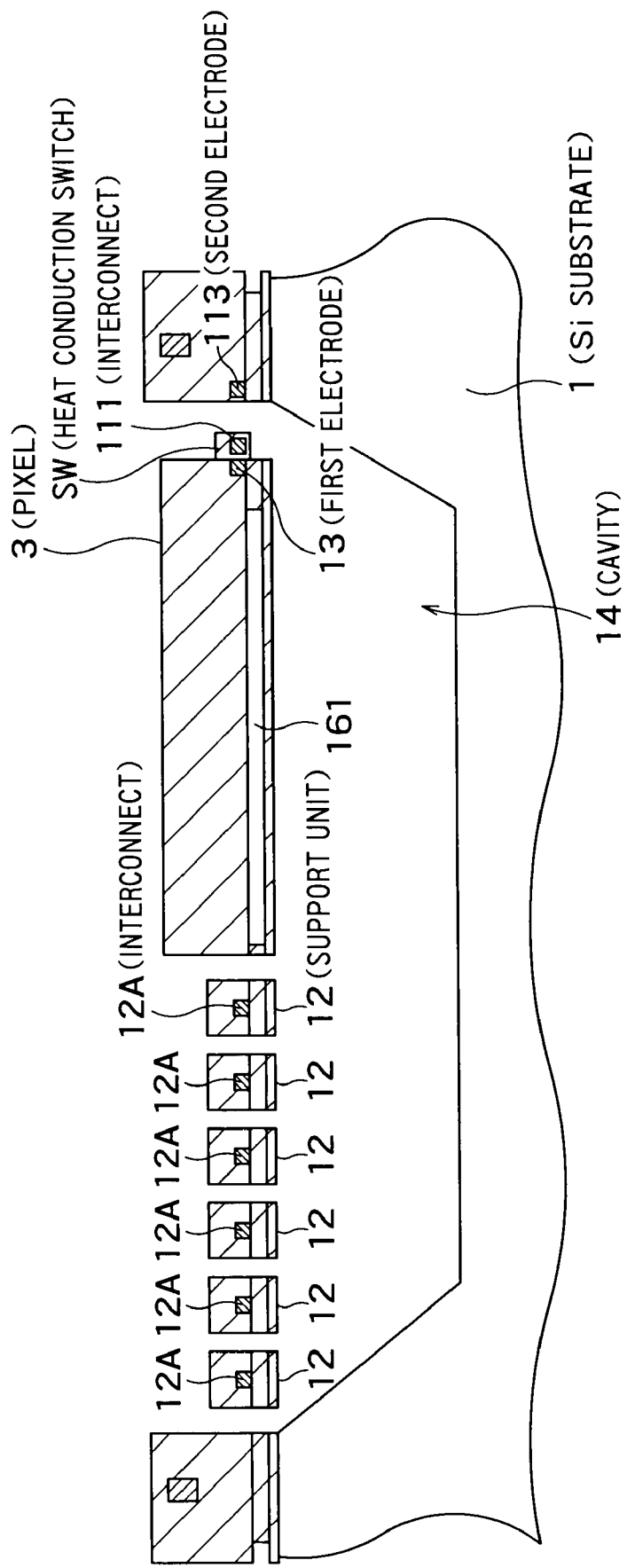
FIG. 4 is a cross-sectional view taken along a line 4-4 of FIG. 2.

A configuration of each of the pixels 3 will be described. FIG. 2 is a plan view of the pixel 3. FIG. 4 is a cross-sectional view taken along a line 4-4 of FIG. 2. As shown in FIG. 4, a cavity 4 is formed in a silicon substrate 1. The pixel 3 is supported on the cavity 14 by a support unit 12. The cavity 14 is formed by etching a surface of the silicon substrate 1. The pixel 3 is formed simultaneously with formation of the cavity 14 by protecting a surface region of the silicon substrate 1. The support unit 12 is formed likely to the pixel 3. Accordingly, the pixel 3 and the support unit 12 are made of silicon. The support unit 12 is formed on the same layer equal in height level as that on which the pixel 3 is formed based on the surface of the silicon substrate 1.

One heat conduction switch SW is provided between the pixel 3 and the silicon substrate 1 (between the pixel 3 and a portion thermally shorted to the silicon substrate 1). As shown in FIG. 2, the heat conduction switch SW is configured so that one end is connected to the silicon substrate 1 and the other end is connected to either the silicon substrate 1 or the pixel 3. Similarly to the pixel 3 and the support unit 12, the heat conduction switch SW is formed simultaneously with the formation of the cavity 14. Further, the heat conduction switch SW is formed on the same layer equal in height level as that on which the pixel 3 and the support unit 12 are formed based on the surface of the silicon substrate 1. The heat conduction switch SW is adjacent to the pixel 3 and formed into, for example, a cantilever made of silicon.

An interconnect 111 is formed in the heat conduction switch SW. The interconnect 111 is made of, for example, metal or doped silicon. A first electrode 13 is provided near a portion of the pixel 3 with which portion the heat conduction switch SW contacts. A second electrode 113 is provided near a portion of the silicon substrate 1 with which portion the heat conduction switch SW contacts. The first electrode 13 is connected to one of the row selection lines 5 shown in FIG. 1 via a terminal 151 and an interconnect 12A. The second electrode 113 is connected to a circuit (not shown) formed on the silicon substrate 1.

Figure 3:
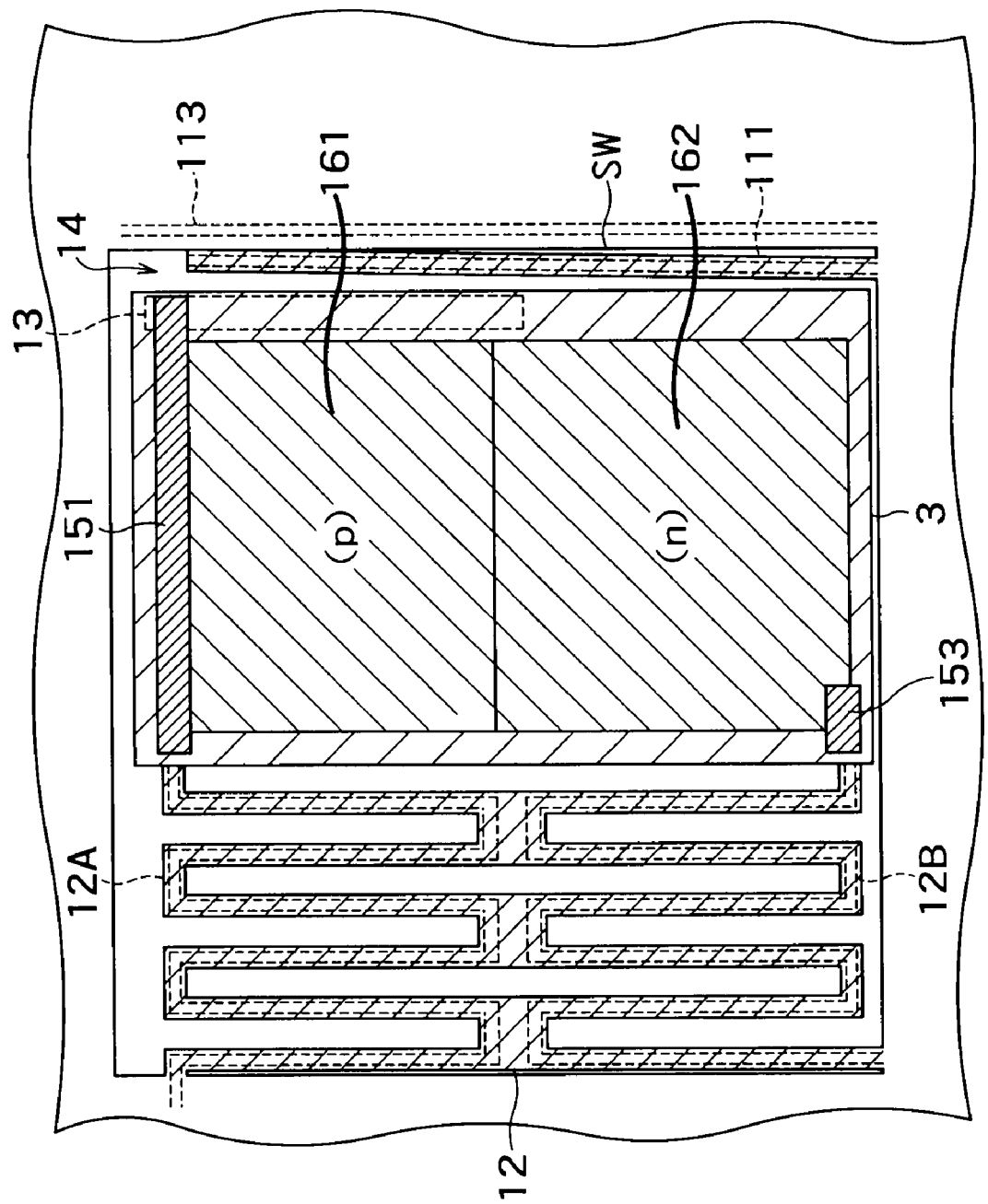
FIG. 3 is a plane view of the pixel 3 in a second state.

By applying a potential to the interconnect 111, the first electrode 13, and the second electrode 113, an attraction force is applied to the heat conduction switch SW to thereby bend the heat conduction switch SW in a direction of either pixel 3 side or silicon substrate 1 side. By changing the potential of the interconnect 111, the first electrode 13 or the second electrode 113, the heat conduction switch SW can change over the state of the imaging region 10 between the first state and the second state. FIG. 2 shows a state in which the heat conduction switch SW is in contact with the pixel 3. The state shown in FIG. 2 corresponds to the second state. FIG. 3 shows a state in which the heat conduction switch SW is in contact with the portion thermally shorted to the silicon substrate 1. The state shown in FIG. 3 corresponds to the first state.

The support unit 12 electrically connects the silicon substrate 1 to the pixel 3 and also mechanically supports the pixel 3. Normally, the sensor 100 is actuated in vacuum, so that the heat generated in the pixel 3 is diffused only from the support unit 12. Nevertheless, the support unit 12 is formed in zigzags so as to thermally separate the pixel 3 from the silicon substrate 1. By forming the support unit 12 longer and thinner, the pixel 3 can be further thermally isolated from the silicon substrate 1. The support unit 12 includes interconnects 12A and 12B. By so configuring, it is possible to supply electric power from the circuit (not shown) formed on the silicon substrate 1 to the pixel 3 via the interconnect 12A or 12B, or to supply the electric signal from the pixel 3 to the circuit formed on the silicon substrate 1 via the interconnect 12A or 12B.

As shown in FIG. 2, the pixel 3 includes a thermoelectric conversion element configured to include an anode 161 and a cathode 162 forming the pn junction 4 shown in FIG. 1. The terminal 151 connected to the anode 161 is connected to one row selection line 5 shown in FIG. 1 via the interconnect 12A. The pulse voltage from the vertical scanner 50 can be thereby transmitted to the anode 161. Furthermore, the constant current from the vertical scanner 50 can be supplied to the anode 161. A terminal 153 connected to the cathode 162 is connected to one signal line 6 shown in FIG. 1 via the interconnect 12B. The corresponding constant-current source 60 can thereby carry the constant current to the cathode 162. Furthermore, the corresponding signal detector 7 can detect the signal voltage generated in the pixel 3 via the signal line 6.

To turn the sensor 100 into the first state, a bias voltage Vdd is applied to the first electrode 13 via the row selection line 5 or the like, and at the same time, a switch voltage Vsw of the interconnect 111 is set to be equal to the bias voltage Vdd. At this time, a potential of the second electrode 113 is set to a ground potential GND. As a result, a potential difference Vdd is generated between the interconnect 111 and the second electrode 113. A force F1 generated between the heat conduction switch SW and the silicon substrate 1 due to this potential difference Vdd is represented by the following Equation (1)

$$F1 = \frac{1}{2} * \in * (Vdd/d)^2 * 2S \quad \text{(Equation 1)}$$

In the Equation (1), if the interconnect 111 and the second electrode 113 are assumed as polar plates of a capacitor, respectively, symbols ∈, d, and S denote a dielectric constant of a material (including a vacuum) between the interconnect 111 and the second electrode 113, a distance between the interconnect 111 and the second electrode 113, and an area by which the interconnect 111 is opposed to the second electrode 113, respectively.

The force F1 is an attraction force which attracts the interconnect 111 and the second electrode 113 to each other. As shown in FIG. 3, the heat conduction switch SW is bent in the direction of the silicon substrate 1 side and contacts with the silicon substrate 1. As a result, the sensor 100 turns into the first state.

To turn the sensor 100 into the second state, the bias voltage Vdd is applied to the first electrode 13 and the potential Vsw of the interconnect 111 is set to the ground potential GND while the potential of the second electrode 113 is set to the ground potential GND. As a result, the potential difference Vdd is generated between the interconnect 111 and the first electrode 13. A force F2 generated between the heat conduction switch SW and the pixel 3 due to this potential difference Vdd is represented by the following Equation (2)

$$F2 = (\frac{1}{2}) * \in' * (Vdd/d')^2 * 2S' \quad \text{(Equation 2)}$$

In the Equation (2), if the interconnect 111 and the first electrode 13 are assumed as polar plates of a capacitor, respectively, symbols ∈', d', and S' denote a dielectric constant of a material (including a vacuum) between the interconnect 111 and the first electrode 13, a distance between the interconnect 111 and the first electrode 13, and an area by which the interconnect 111 is opposed to the first electrode 13, respectively.

The force F2 is an attraction force which attracts the interconnect 111 and the first electrode 13 to each other. As shown in FIG. 3, the heat conduction switch SW is bent in the direction of the pixel 3 side and contacts with the pixel 3. As a result, the sensor 100 turns into the second state.

Figure 5:
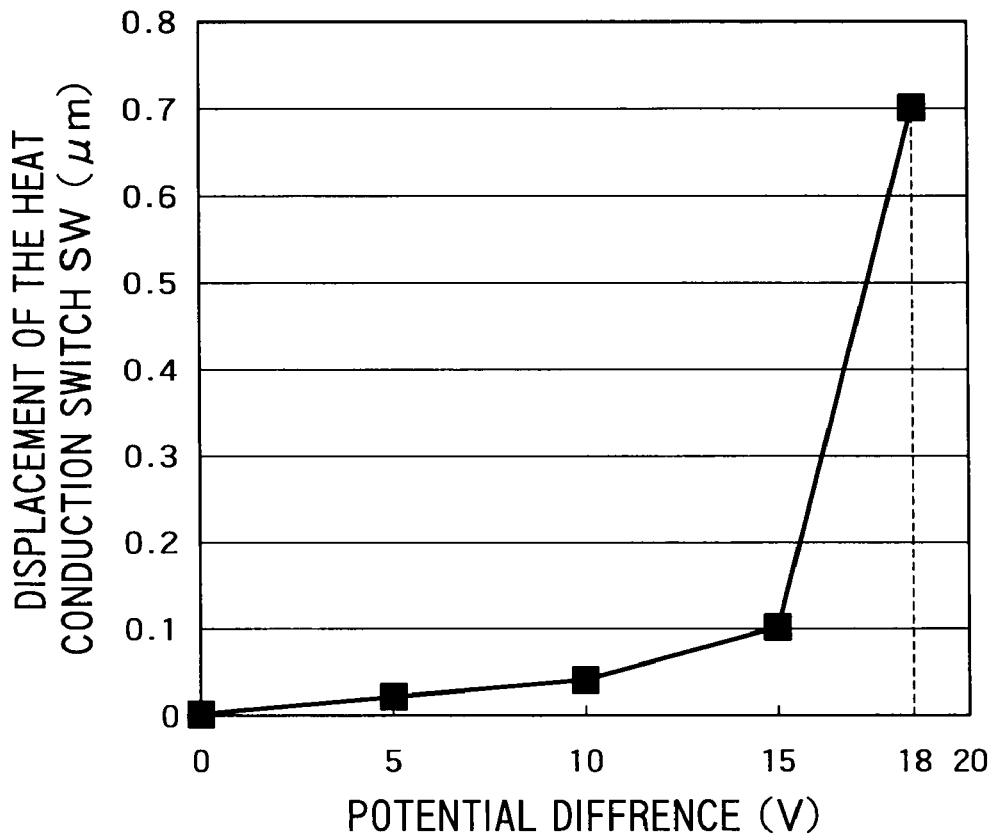
FIG. 5 is a graph showing a displacement of a heat conduction switch.

It is assumed, for example, that the heat conduction switch SW is structured so that a silicon oxide film having a thickness of 0.1 μm is coated onto surroundings of polysilicon having a thickness of 0.5 μm and a width of 0.5 μm. It is also assumed that a gap between the heat conduction switch SW and a side surface of the pixel 3 is 0.7 μm. In this case, as obvious from FIG. 5, the heat conduction switch SW contacts with the pixel 3 when the potential difference between the heat conduction switch SW and the pixel 3 is about 18 V.

Figure 6:
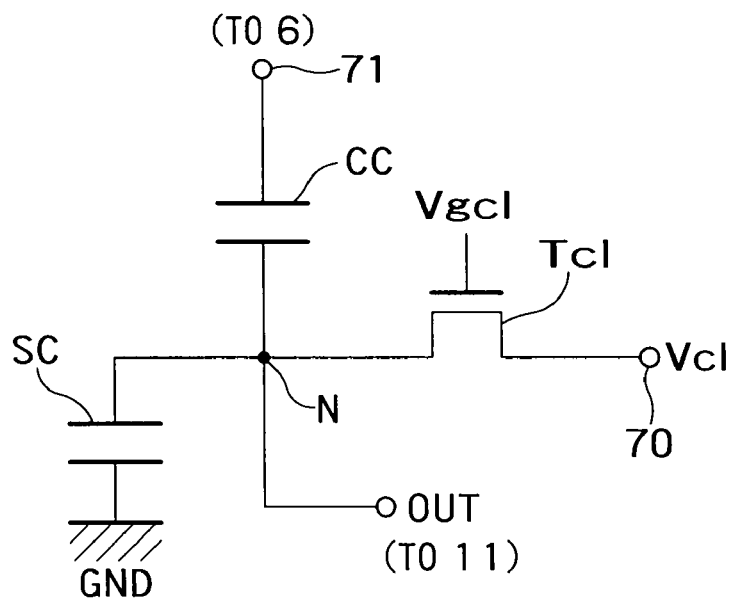
FIG. 6 is a circuit diagram of the signal detectors 7.

FIG. 6 is a circuit diagram of each of the signal detectors 7. The signal detector 7 is also referred to as "correlation double sampling circuit". The signal detector 7 includes a first node N, a coupling capacitor CC, a clamping transistor Tcl, a storage capacitor SC, and an output terminal OUT. A terminal 71 is connected to one signal line 6. The coupling capacitor CC capacitively couples the first node N to the signal line 6. A terminal 70 is connected to a clamping voltage source that supplies the constant voltage Vcl. The clamping transistor Tcl is connected between the first node N and the clamping voltage source. The transistor Tcl is controlled to be turned on or off according to a gate voltage Vgcl. The storage capacitor SC is connected between the first node N and the ground potential GND, and keeps a reference potential by storing therein charges during a clamping operation. The output terminal OUT outputs a voltage detected at the first node N.

Figure 7:
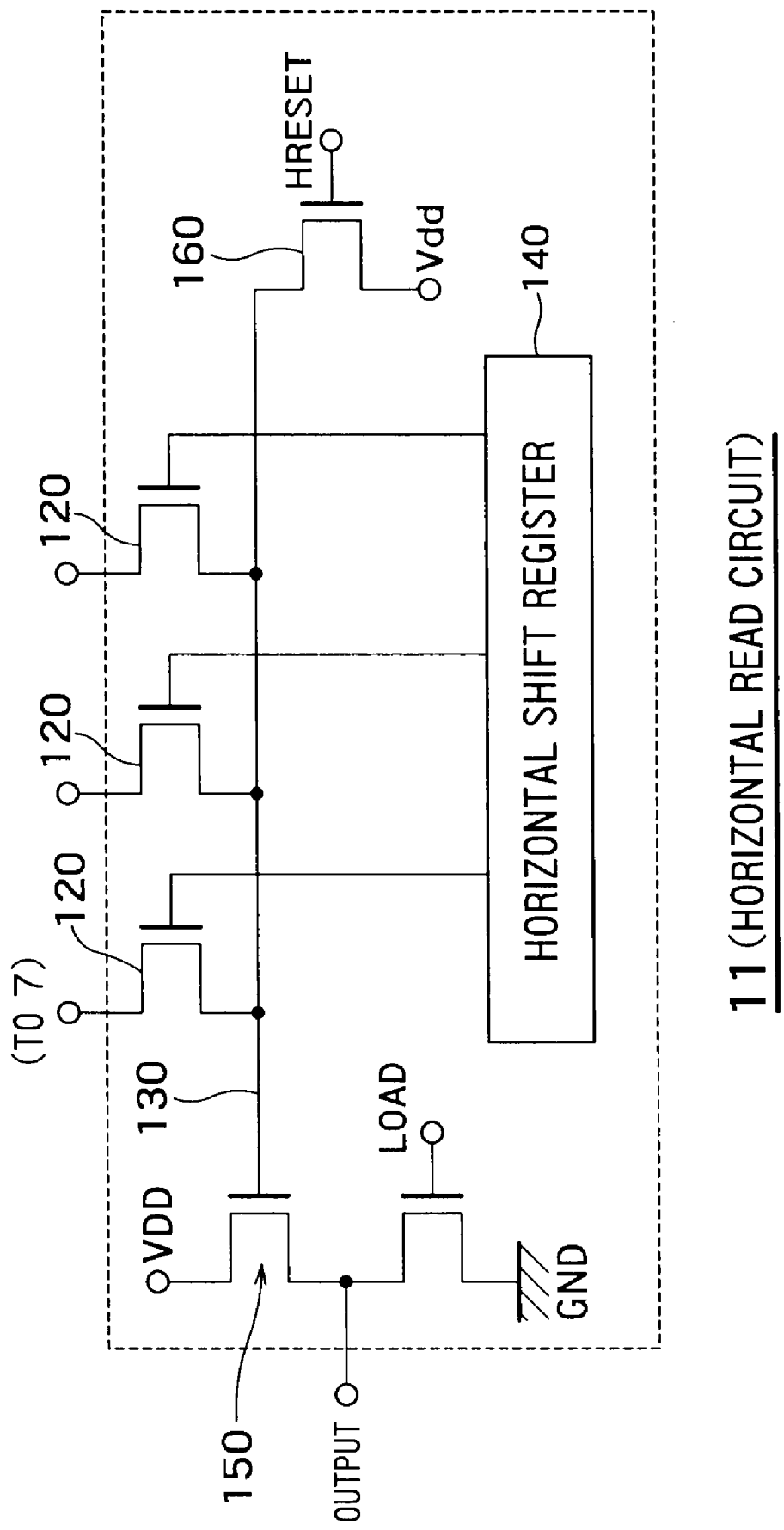
FIG. 7 is a circuit diagram of the horizontal read circuit 11.

FIG. 7 is a circuit diagram of the horizontal read circuit 11. The horizontal read circuit 11 includes horizontal selection transistors 120, a read line 130, a horizontal shift register 140, a source follower circuit 150 serving as a buffer circuit, and a read reset switch 160. Each of the horizontal selection transistors 120 is connected between the read line 130 and each of the signal detectors 7. The horizontal shift register 140 is connected to gates of the respective horizontal selection transistors 120. The horizontal shift register 140 sequentially transmits signals output from the signal detectors 7 to the read line 130 by sequentially turning on the horizontal selection transistors 120. The output signals from the signal detectors 7 are output from the read line 130 to the outside of the sensor 100 via the source follower circuit 150. The read reset switch 160 is provided to reset the read line 130 to the bias voltage Vdd after the signal output from a certain signal line 6 is read. The source follower circuit 150 functions as a buffer circuit. An inverter amplifier circuit may be employed as the buffer circuit in place of the source follower circuit 150.

Figure 8:
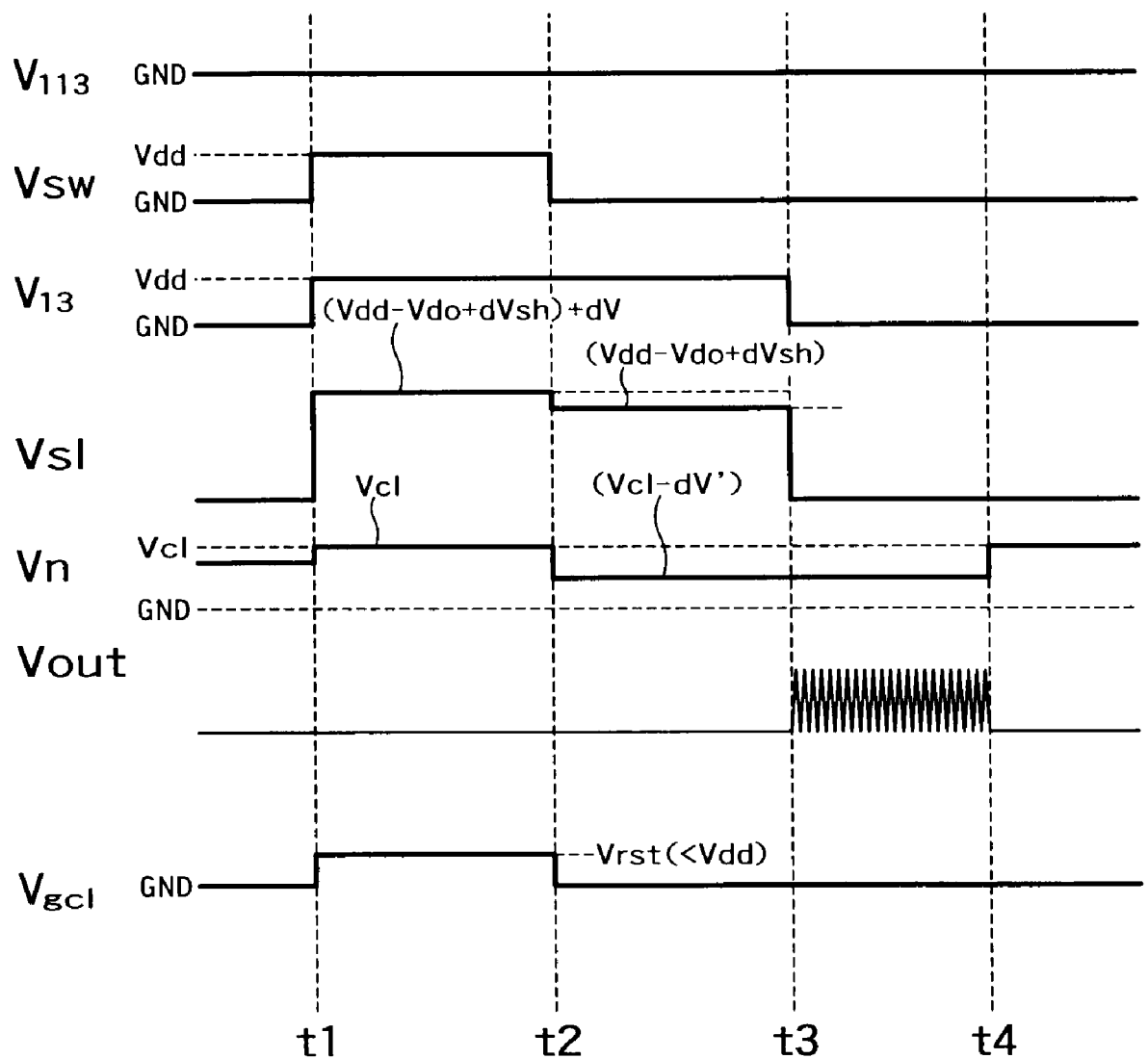
FIG. 8 is a timing chart showing an operation of the sensor 100.

With reference to FIG. 8, an operation performed by the sensor 100 according to the first embodiment will be described next.

Before t1, the imaging region 10 absorbs an incident light and the temperature of the imaging region 10 rises. In a period between t1 and t2, the bias voltage Vdd is applied to the pn junctions 4 of the pixels 3 via the row selection lines 5. At the same time, the voltage Vsw of the interconnect 111 of each of the heat conduction switches SW is raised to Vdd. By applying the bias voltage Vdd to the row selection lines 5, a voltage V13 of the first electrode 13 rises to Vdd. At this moment, a voltage V113 of the second electrode 113 remains the ground potential GND. As a result, the potential difference Vdd is generated between the interconnect 111 and the second electrode 113, thereby turning the sensor 100 into the first state. Namely, in the period between t1 and t2, each pixel 3 is in the state in which the pixel 3 is thermally isolated from the silicon substrate 1.

At this time, the voltage Vsl of each signal line 6 is (Vdd−Vd0+dVsh+dV). Symbol Vd0 denotes a voltage applied to the pn junction 4 in the dark state. Symbol dVsh denotes a self-heating voltage component generated at the pn junction 4 by pulse voltages V13 to V43 (see FIG. 8) applied from the vertical scanner 50 shown in FIG. 1. Symbol dV denotes a signal voltage component generated by the incident light. Namely, if the heat is not generated in each pixel 3 by the incident light (in case of the dark state), the voltage Vsl of each signal line 6 is (Vdd−Vd0+dVsh). Accordingly, in the period between t1 and t2, i.e., in the first state, the voltage Vsl is (Vdd−Vd0+dVsh+dV) obtained by adding bias components (Vdd−Vd0+dVsh) to the signal voltage component dV resulting from the incident light.

A signal voltage ΔV resulting from the incident light is considered and represented as follows. The temperature of each pixel 3 is raised by ΔT, which is represented by the following Equation (3), by heat energy generated by the incident light.

$$\Delta T = \frac{P_a}{G_{th}}\{1 - \exp(-tG_{th}/C_{th})\} \qquad \text{(Equation 3)}$$

In the Equation (3), Gth denotes a heat conductance of the support unit 12, Pa denotes an energy amount of Joule heat generated in each pixel 3, t denotes passing time since start of reception of electric signals, and Cth denotes a heat capacity of the pixel 3.

The temperature rise (self-heating temperature component) ΔT of the pixel 3 nears a value represented by the following Equation (4) in a stationary state (t→∞).

$$\Delta T = \frac{P_a}{G_{th}} \qquad \text{(Equation 4)}$$

As obvious from the following Equation (4), the temperature rise ΔT of the pixel 3 due to the incident light is decided only by the energy amount of the incident light and the heat conductance of the support unit 12 in the stationary state. For example, if the constant current is applied to the pn junction 4 and a change in voltages on both ends of the pn junction 4 is detected, the thermoelectric conversion efficiency is represented by dV/dT. Therefore, in the stationary state, the pixel 3 outputs a voltage dV represented by the Equation (5). The voltage dV corresponds to the signal voltage component resulting from the incident light.

$$dV = \Delta T \cdot \frac{dV}{dT} = \frac{P_a}{G_{th}} \frac{dV}{dT} \qquad \text{(Equation 5)}$$

The self-heating voltage component dVsh is a voltage generated by self heating (a self-heating temperature component) ΔTsh represented by the following Equation (6).

$$\Delta Tsh = \frac{Vd0 * If}{Gth}(1 - \exp(-tGth/Cth)) \qquad \text{(Equation 6)}$$

In the Equation (6), symbol "If" denotes a forward current carried across the diode (pn junction) 4 and t denotes passing time since a current starts to be applied to the diode (pn junction) 4. The self-heating temperature component ΔTsh will be described later with reference to FIG. 9.

In the period between to and t2, the gate voltage Vgcl shown in FIG. 6 rises to high level potential Vrst, and the clamping transistor Tcl is turned on. Accordingly, a potential Vn of the first node N is kept equal to the clamping voltage Vcl serving as the reference voltage. At this moment, a voltage (Vcl−(Vdd−V0+dVsh+dv)) is applied to both ends of the coupling capacitor CC. Since the first node N is capacitively coupled to the signal line 6, charges according to the Equation (5) are stored in the storage capacitor SC from the terminal 70. Such an operation between t1 and t2 is called "clamping operation". The charges stored in the storage capacitor SC are held during an operation in a next period from t2 to t3, whereby the potential Vn of the first node N is kept equal to the clamping voltage Vcl in the period between t2 and t3. Accordingly, in the period between t2 and t3, the clamping voltage Vcl serves as the reference potential.

Figure 9:
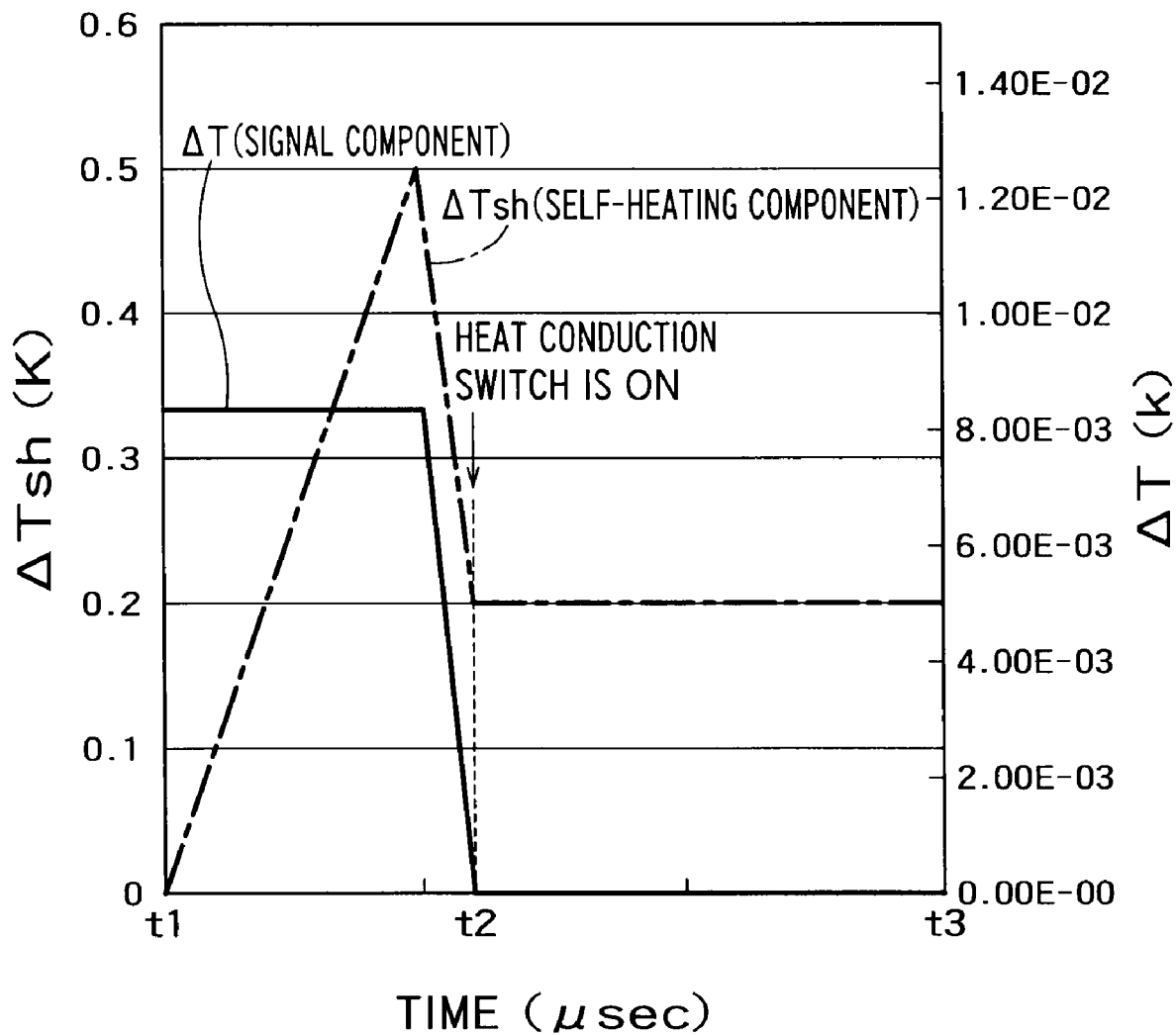
FIG. 9 is a graph showing the signal component ΔT and the self-heating temperature component ΔTsh.
Figure 10:
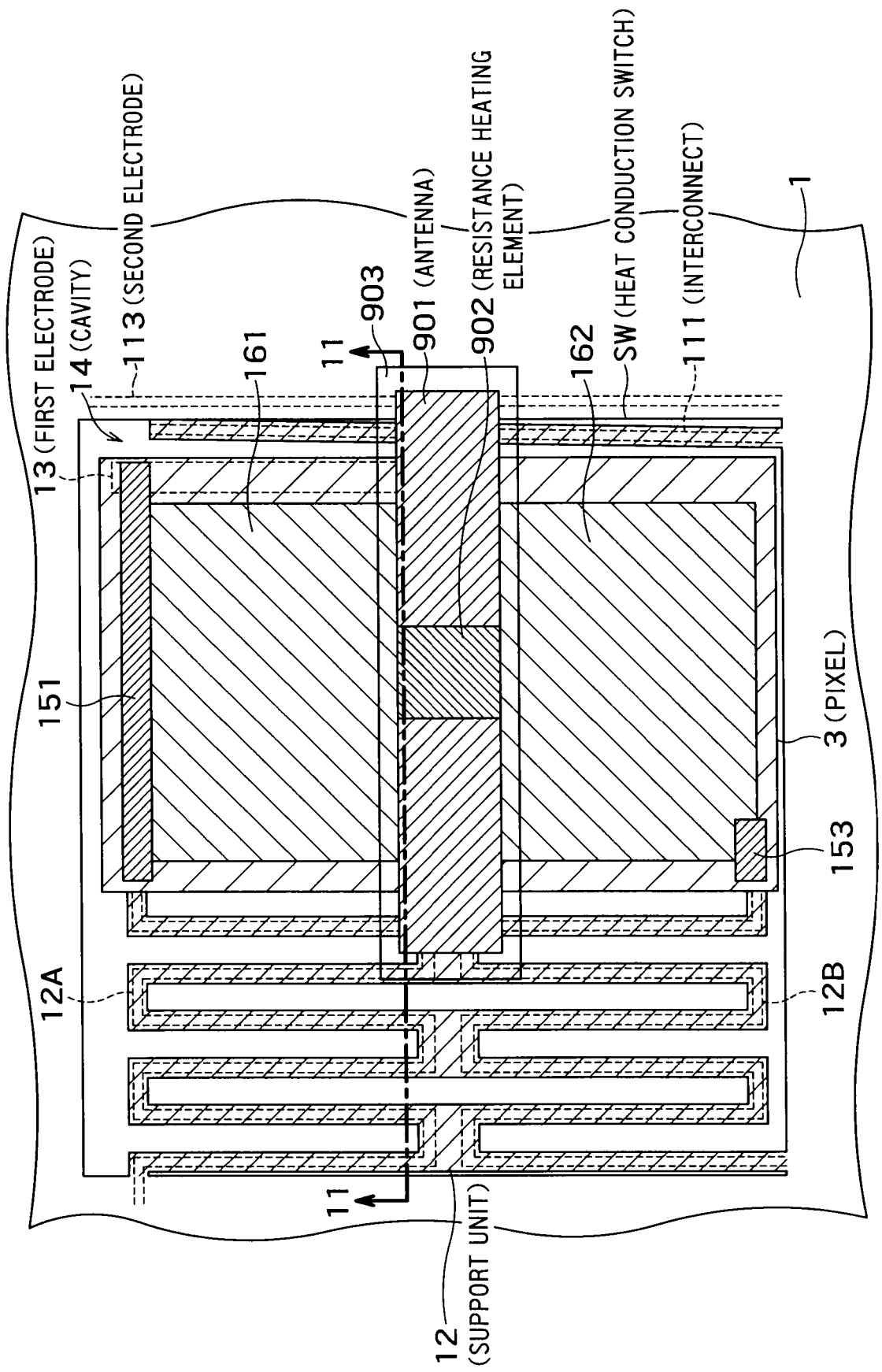
FIG. 10 is a plane view of the pixel according to a second embodiment.

With reference to FIG. 9, the self-heating temperature component ΔTsh and the signal temperature component ΔT resulting from the incident light in the period between to and t2 will be described below. It is assumed that the heat conductance between each pixel 3 and the silicon substrate 1 in the period between t1 and t2 (in the period in which the heat conduction switch SW is turned off) is Gth_leg=100 nW (nanoWatt)/K (Kelvin). Further, the heat conductance between each pixel 3 and the silicon substrate 1 in the period between t2 and t3 (in the period in which the heat conduction switch SW is turned on) is Gth_sw=50 μW/K. In this case, the self-heating temperature component ΔTsh and the signal temperature component ΔT resulting from the incident light change as shown in FIG. 9. The self-heating temperature component ΔTsh and the signal temperature component ΔT are temperature components for the pixel 3 based on the temperature of the silicon substrate 1, respectively.

In the period between t1 and t2 (in the first state), the signal temperature component ΔT is steady state shown in the Equation (4). The signal temperature component ΔT is almost constant to, for example, $8 \times 10^{-3}$ K. On the other hand, the self-heating temperature component ΔT rises because a current is carried across each pn junction 4 at the rise of the pulse voltage (e.g., V13).

Referring back to FIG. 8, in the period between t2 and t3, while the bias voltage Vdd is kept applied to the pn junction 4, the voltage Vsw of the interconnect 111 of each heat conduction switch SW is lowered to the ground potential GND. As a result, the potential difference Vdd is generated between the interconnect 111 and the first electrode 13, thus turning the sensor 100 into the second state. Namely, in the period between t2 and t3, each pixel 3 turns into a state in which the pixel 3 is thermally shorted to the silicon substrate 1.

At this time, the voltage Vsl of each signal line 6 is (Vdd−Vd0+dVsh). This is because the heat generated by the incident light is diffused from each pixel 3 to the silicon substrate 1 since the pixel 3 is thermally shorted to the silicon substrate 1. In other words, the pixel 3 turns into the dark state.

As shown in FIG. 9, in the period between t2 and t3, the self-heating temperature component ΔTsh is not zero. That is, the self-heating voltage component dVsh is not zero. At t2, when the state of the imaging region 10 is changed from the first state to the second state, the heat conduction switch SW contacts with each pixel 3. As a result, the signal temperature component ΔT and the self-heating temperature component ΔTsh are diffused to the silicon substrate 1 from each pixel 3 via the heat conduction switch SW. Accordingly, the signal temperature component ΔT is almost zero whereas the self-heating temperature component ΔTsh is, for example, about 0.1 K for the following reason. In the period between t2 and t3, the pulse voltage is not lowered yet. Due to this, the self-heating temperature component ΔTsh continues to be generated while being diffused to the silicon substrate 1.

In the period between t2 and t3, the gate voltage Vgcl shown in FIG. 6 falls to the ground potential GND and the clamping transistor Tcl is turned off. Accordingly, the charges of the first node N are held, and the potential Vn of the first node N falls from the reference voltage Vcl by as much as a voltage (dV'+dVsh') proportional to the signal voltage component ΔV and the self-heating voltage component dVsh (dV+dVsh). Namely, the voltage Vn of the first node N is equal to a second voltage (Vcl−dV'−dVsh'). If a capacity ratio of the coupling capacitor CC to the storage capacitor SC is, for example, 1:1, the voltage (dV'+dVsh') is equal to ½*(dV+dVsh). In this case, as shown in FIG. 9, the self-heating voltage component dVsh is a constant voltage and far lower than the bias component (Vdd−Vd0). Further, the self-heating voltage component dVsh has no change among frames and hardly has irregularities among the pixels 3. Moreover, because the voltage Vcl is a preset constant voltage, it is possible to easily extract the signal voltage component dV' of the incident light from the second voltage (Vcl−dV'−dVsh').

In a period between t3 and t4, the horizontal read circuit 11 selects one signal detector 7 in order of columns, and output the voltage Vn=(Vcl−dV'−dVsh') of the first node N of the selected signal detector 7 as a voltage Vout. The horizontal read circuit 11 serially reads voltages Vn in all columns. Therefore, as the voltage Vout shown in FIG. 8, signals as many as columns appear in the period between t3 and t4.

After t4, the operation performed from t1 to t4 is repeated in the next pixel row. At this time, pulse voltages V23 to V43 shown in FIG. 1 are used. As a result, signals from all the pixels 3 included in the imaging region 10 are output.

In the first embodiment, the signal voltage component dV' is obtained from (Vcl−dV') without consideration to the bias component (Vdd−Vd0) as already stated. Since the signal voltage component dV' does not depend on the bias component (Vdd−Vd0), the irregularities in fixed pattern among the pixels 3 and the influence of the 1/f noise can be eliminated. The sensor 100 according to the first embodiment can thereby improve an S/N ratio (signal-to-noise ratio). Moreover, since the irregularities in fixed pattern among the pixels 3 and the influence of the 1/f noise are not present, there is no need to provide an elimination circuit for eliminating them. Therefore, the sensor 100 according to the first embodiment can be advantageously made small in size and manufactured at low cost.

Note that the bias component (Vdd−Vd0) is irregular among the pixels 3. If a signal is a faint signal having the signal voltage component dV, for example, equal to or lower than 1 mV, the bias component (Vdd−Vd0) has often an irregularity of about several tens of millivolts among the pixels 3. In this case, the bias component (Vdd−Vd0) is output as a fixed pattern greater than the signal voltage component dV' by one digit. According to the first embodiment, the signal voltage component dV' can be detected without influence of the irregularities in bias component (Vdd−Vd0).

Moreover, according to the first embodiment, signals in the bright state (t1 to t2) and signals in the dark state (t3 to t4) are chopped off at high frequency. It is, therefore, possible to greatly eliminate the 1/f noise.

In the first embodiment, one pixel 3 includes one pn junction 4. Alternatively, one pixel 3 may be configured to include a diode string in which a plurality of pn junctions (diodes) is connected in series.

Second Embodiment

Figure 11:
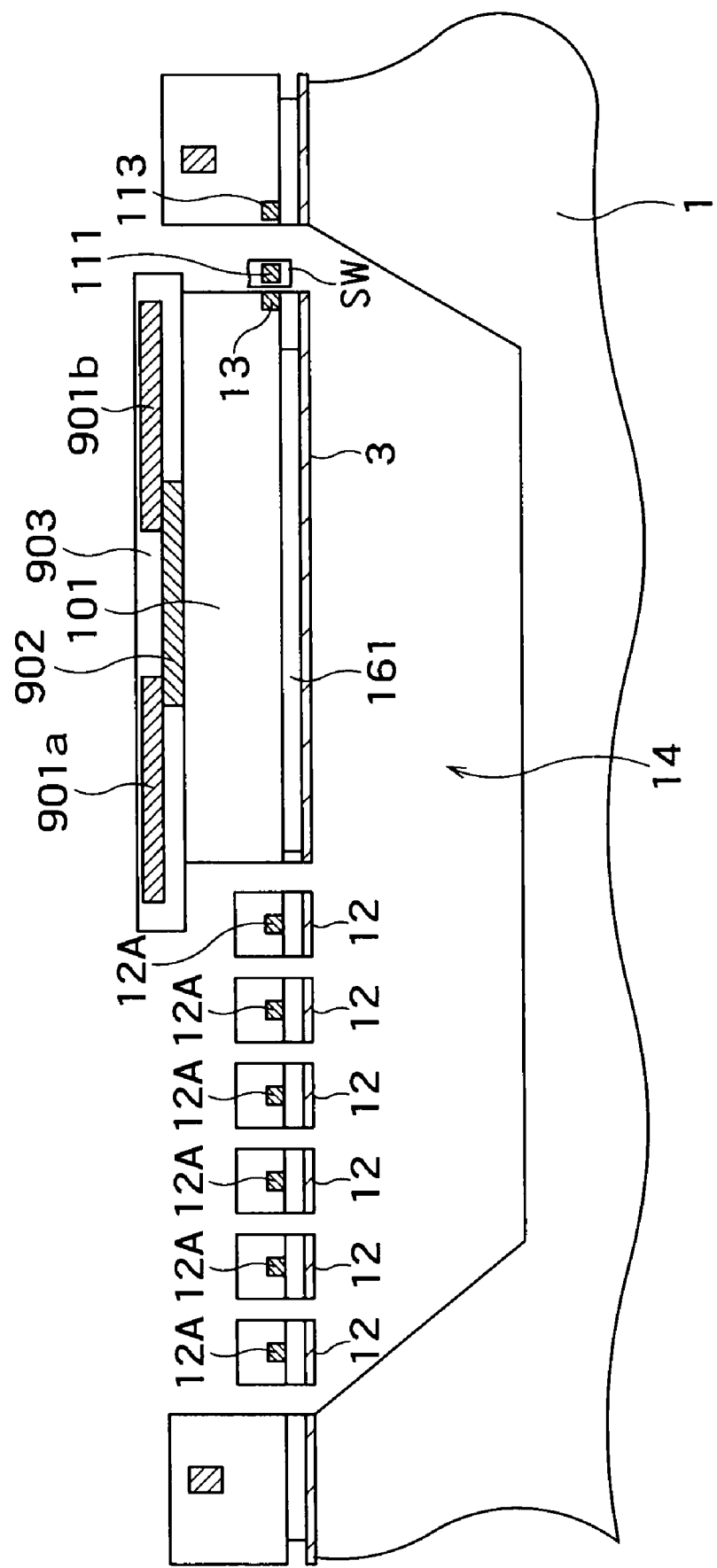
FIG. 11 is a cross-sectional view taken along a line 11-11 of FIG. 10.

As shown in FIG. 11, a pixel 3 according to a second embodiment of the present invention includes an antenna 901 receiving an electromagnetic wave and converting the electromagnetic wave into an electric signal, and a resistance heating element 902 converting the electric signal generated in the antenna 901 into Joule heat and raising a temperature of the pixel 3. The remaining constituent elements of the second embodiment can be the same as those according to the first embodiment.

The antenna 901, which is made of a metal film having a quite low electric resistance, receives an incident electric wave. The resistance of the antenna 901 is preferably as low as, for example, 10 Ω. A length of the antenna 901 is preferably about half the wavelength of the electric wave to be received. By so configuring, the antenna 901 can selectively receive the electric wave at a long wavelength as stated above.

As shown in FIG. 11, the antenna 901 is divided into, for example, a first antenna unit 901a and a second antenna unit 901b. The first antenna unit 901a and the second antenna unit 901b are electrically connected to the resistance heating element 902. The resistance heating element 902 has a resistance of, for example, about 200 Ω.

Although the resistance heating element 902 and the antenna 901 are electrically separated from the thermoelectric conversion element (including the anode 161 and the cathode 162) provided on a lower layer, they are thermally integrated with the thermoelectric conversion element. The antenna 901 and the resistance heating element 902 are coated with an antenna protection film 903. The antenna protection film 903 functions to protect the antenna 901 and the resistance heating element 902 from an etching solution used during the formation of the cavity 14.

An electromagnetic wave to be processed by a solid-state image pickup device 1 according to the second embodiment is present in a quite high frequency range from a gigahertz band to a terahertz band. It is difficult to convert the electromagnetic wave into an electric signal and to detect the electric signal. Considering these, each pixel 3 according to the second embodiment converts the Joule heat generated when a current produced by the electromagnetic wave passes through the resistance heating element 902 into an electric signal. The Joule heat Pa is represented by the following Equation (7)

$$Pa = Ia^2 * Ra \quad \text{(Equation 7)}$$

In the Equation (7), Ia denotes the current generated by the electromagnetic wave and Ra denotes the resistance value of the resistance heating element 902.

Subsequent processing is the same as that according to the first embodiment. In this manner, according to the second embodiment, only the signal voltage component dV resulting from reception of the electromagnetic wave can be extracted using the heat conduction switches SW. According to the second embodiment, not only the infrared light but also the electric wave in the terahertz band or the millimeter wave band can be read with high S/N. Moreover, the second embodiment can obtain the same advantages as those of the first embodiment.

Third Embodiment

Figure 12:
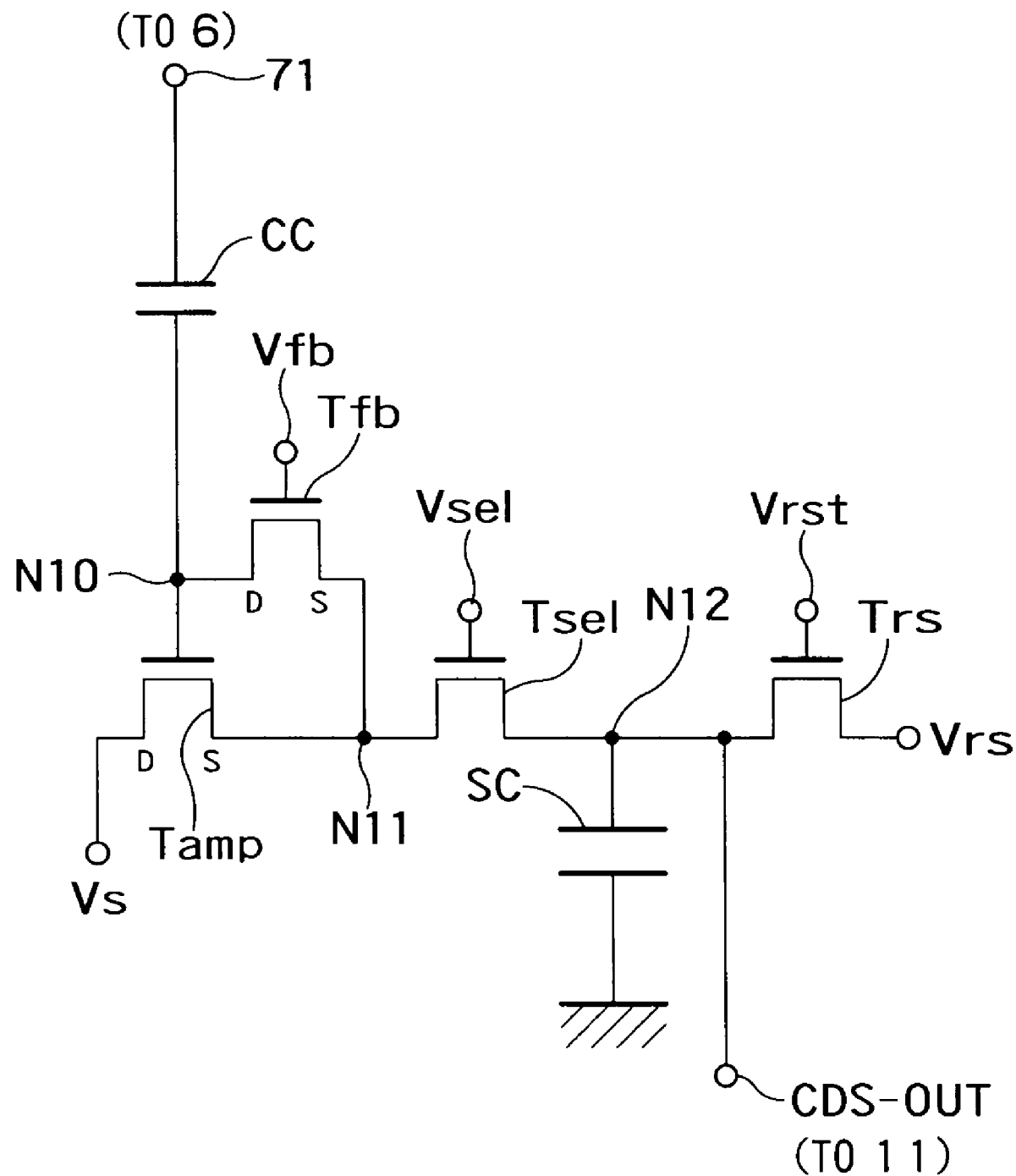
FIG. 12 is a circuit diagram of the column amplifier 7.

According to a third embodiment of the present invention, a faint signal output from each pixel 3 is amplified and a difference between a bright-state signal and a dark-state signal is output. To realize such an operation, a column amplifier including an amplifier transistor Tamp, nodes N10 to N12, a coupling capacitor CC, a feedback transistor Tfb, a storage capacitor SC, a selection transistor Tsel, and a reset transistor Trs is employed as a signal detector 7 according to the third embodiment, as shown in FIG. 12.

The node N11 is connected to a drain of the amplifier transistor Tamp. The node N10 is connected to a gate of the amplifier transistor Tamp. The coupling capacitor CC is connected between the node N10 and one signal line 6, and capacitively couples the gate of the amplifier transistor Tamp to the signal line 6. The feedback transistor Tfb is connected between the nodes N11 and N10, and connects the gate of the amplifier transistor Tamp to the drain thereof during a clamping operation. By doing so, the feedback transistor Tfb holds threshold voltage information on the amplifier transistor Tamp in the gate of the amplifier transistor Tamp.

The selection transistor Tsel is connected between the nodes N11 and N12. The selection transistor Tsel transmits a reset voltage Vrs to the node N11 during the clamping operation, and transmits a potential of the node N11 to the node N12 during a read operation.

The storage capacitor SC is connected between the node N12 and a reference voltage (ground), and stores therein charges carried across the amplifier transistor Tamp via the selection transistor Tsel. If the amplifier transistor Tamp is an N-MOSFET, the charges stored in the storage capacitor SC are electrons.

The reset transistor Trs is connected between the node N12 and the reset voltage Vrs, and turned on during a reset operation for setting potentials of the nodes N12 and N11 to the reset voltage Vrs. When the reset transistor Trs is turned on, the potential of the storage capacitor SC is reset to the reset voltage Vrs.

The node N12 is present between the reset transistor Trs and the selection transistor Tsel, and serves as an output node CDS-out connected to the horizontal read circuit 11.

As can be understood, the third embodiment differs from the first and second embodiments in the configuration of the signal detector 7. The remaining constituent elements of the third embodiment can be the same as those according to the first or second embodiment.

Figure 13:
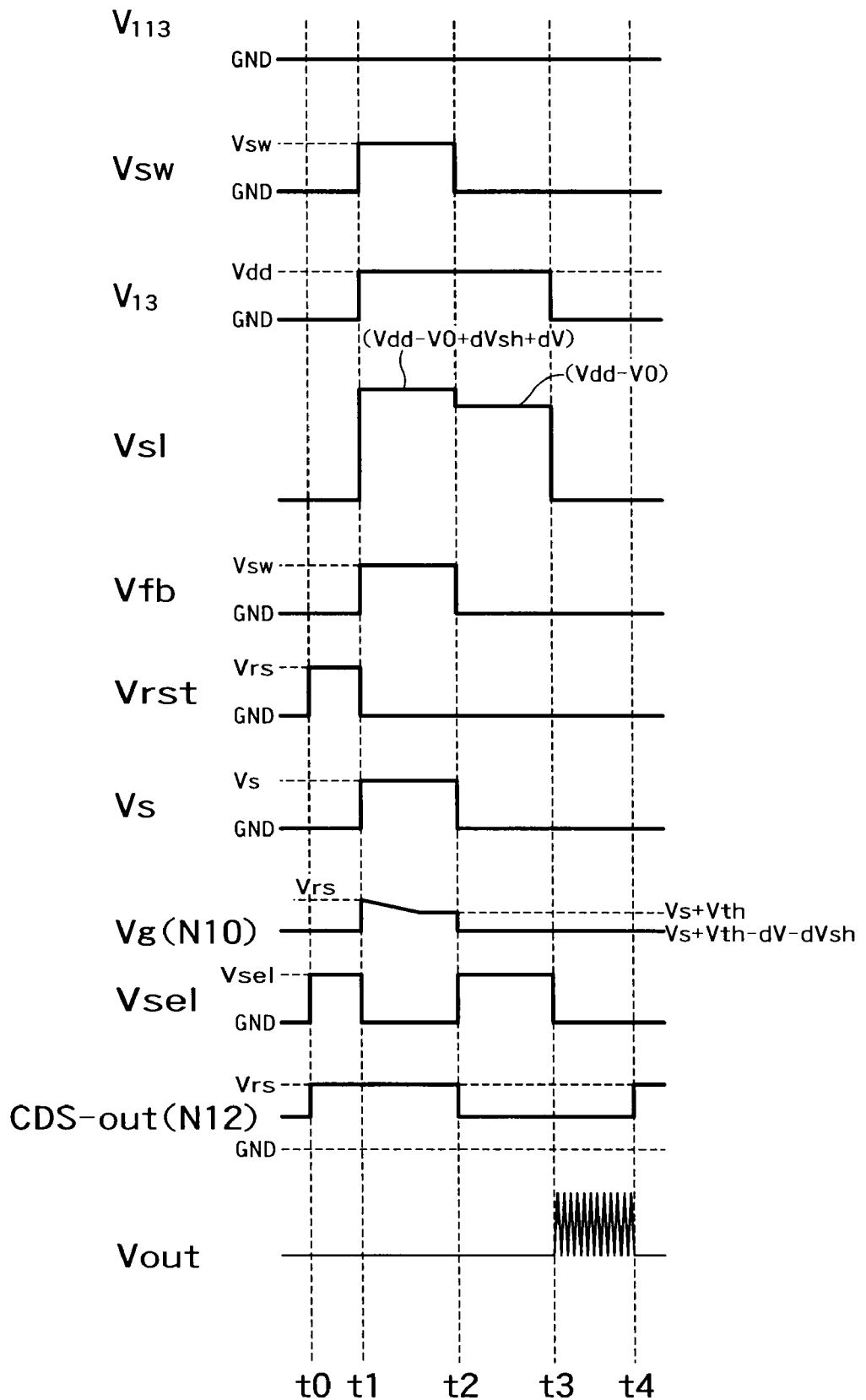
FIG. 13 is a timing chart showing an operation performed by a sensor according to the third embodiment.

FIG. 13 is a timing chart showing an operation performed by a sensor according to the third embodiment. In a period between t0 and t1, the storage capacitor SC is reset. More specifically, a gate voltage Vrst of the reset transistor Trs and a gate voltage Vsel of the selection transistor Tsel are raised by a pulse voltage. A voltage of the storage capacitor SC and a drain voltage of the amplifier transistor Tamp are thereby set to the reset voltage Vrs. In other words, the potentials of the nodes N11 and N12 become equal to the reset voltage Vrs.

In a period between t1 and t2, the potential of the signal line 6 is (Vdd−V0+dVsh+dV) similarly to the first embodiment. The transistor Tamp is, therefore, turned on. At this moment, a gate voltage Vfb of the feedback transistor Tfb is raised by the pulse voltage to thereby turn on the feedback transistor Tfb. At the same time, a source potential Vs of the amplifier transistor Tamp is raised to satisfy Vs>0. At this time, the selection transistor Tsel is turned off. The source voltage Vs is connected to the node N10 via the transistors Tamp and Tfb. Accordingly, as shown in FIG. 13, a potential Vg of the node N10 is closer to the drain voltage Vrs of the amplifier transistor Tamp in the initial period. Thereafter, however, current is carried from the node N10 to the node N11 via the feedback transistor Tfb. As a result, the gate voltage Vg of the amplifier transistor Tamp (the voltage Vg of the node N10) is closer to a clamping voltage (Vs+Vth).

In a period between t2 and t3, the gate voltage Vfb of the feedback transistor Tfb is set to zero V to thereby turn off the feedback transistor Tfb. At this moment, the heat conduction switch SW changes over the state of the imaging region 10 to the second state. Due to this, a potential Vsl of the signal line 6 is changed to (Vdd−Vd0). Further, the gate voltage Vg of the amplifier transistor Tamp (the voltage Vg of the node N10) is lower than the clamping voltage (Vs+Vth) by (dVsh+dV). As a result, current corresponding to the voltage (Vs+Vth−dVsh−dV) is carried from the storage capacitor SC toward the node N11. An amount of current carried at that moment corresponds to a voltage drop of the storage capacitor SC. Furthermore, the voltage (Vs+Vth−dVsh−dV) is output from the output node CDS-out to the horizontal read circuit 11 and read by the horizontal read circuit 11.

Since an operation performed by the horizontal read circuit 11 from t3 to t4 is the same as that according to the first embodiment, it will not be described herein.

According to the third embodiment, the signal voltage resulting from the incident light can be amplified, integrated, and output without irregularities in fixed pattern among the pixels 3 and the influence of the 1/f noise.

Fourth Embodiment

Figure 15:
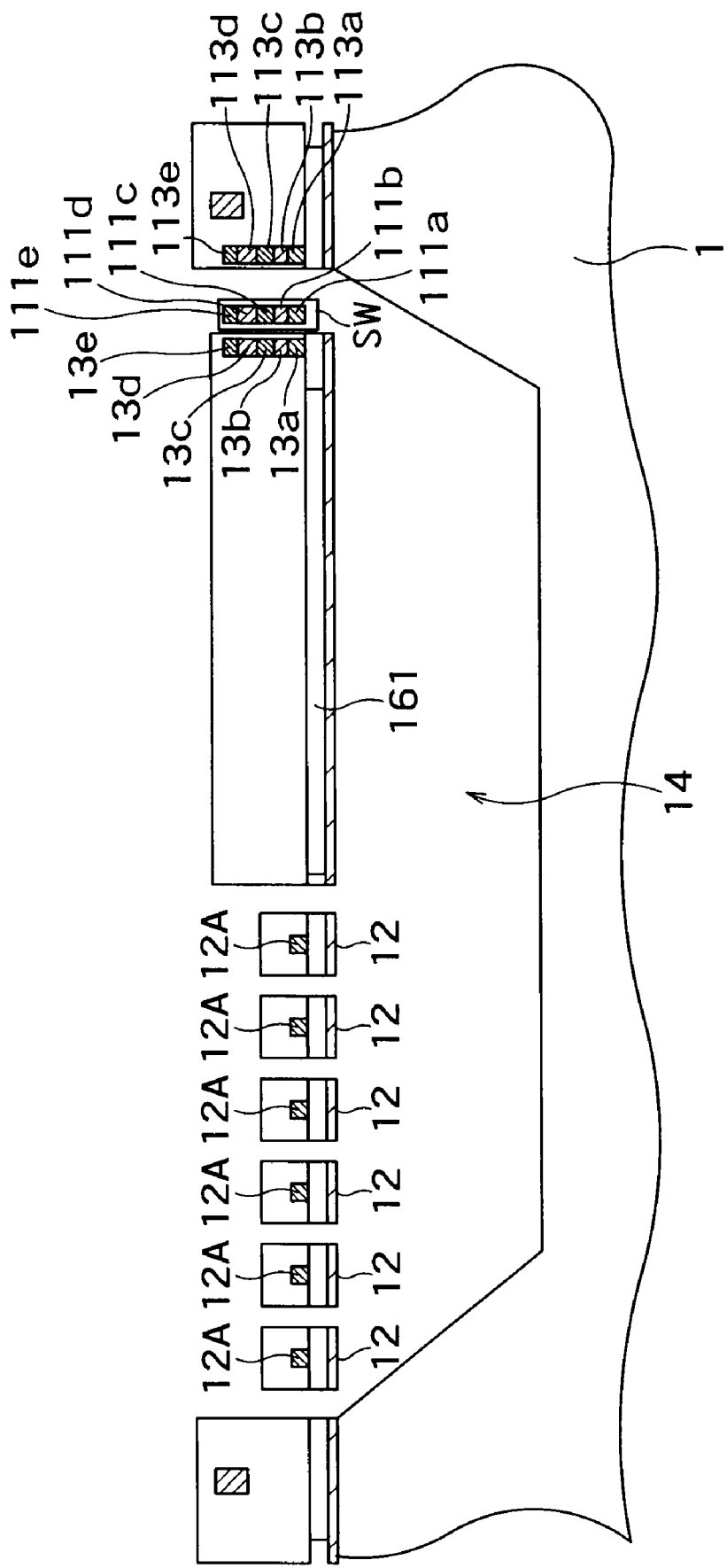
FIG. 15 is a cross-sectional view taken along a line 15-15 of FIG. 14.

As shown in FIG. 15, according to a fourth embodiment of the present invention, the heat conduction switch SW has a stacked structure long in the vertical direction to the surface of the silicon substrate 1. More specifically, the heat conduction switch SW includes a polysilicon layer 111*a*, and one or more metal layers are formed on the polysilicon layer 111*a*. In FIG. 15, two metal layers 111*c* and 111*e* are deposited on the polysilicon layer 111*a*. To make potentials of the metal layers 111c and 111e and the polysilicon layer 111a equal, contacts 111b and 111d are connected to the metal layers 111c and 111e, respectively.

The first electrode 13 includes a polysilicon layer 13a and one or more metal layers are formed on the polysilicon layer 13a. In FIG. 15, two metal layers 13c and 13e are deposited on the polysilicon layer 13a. To make potentials of the metal layers 13c and 13e and the polysilicon layer 13a equal, contacts 13b and 13d are connected to the metal layers 13c and 13e, respectively. The second electrode 113 includes a polysilicon layer 113a, and one or more metal layers are formed on the polysilicon layer 113a. In FIG. 15, two metal layers 113c and 113e are deposited on the polysilicon layer 113a. To make potentials of the metal layers 113c and 113e and the polysilicon layer 113a equal, contacts 113b and 113d are connected to the metal layers 113c and 113e, respectively.

Figure 14:
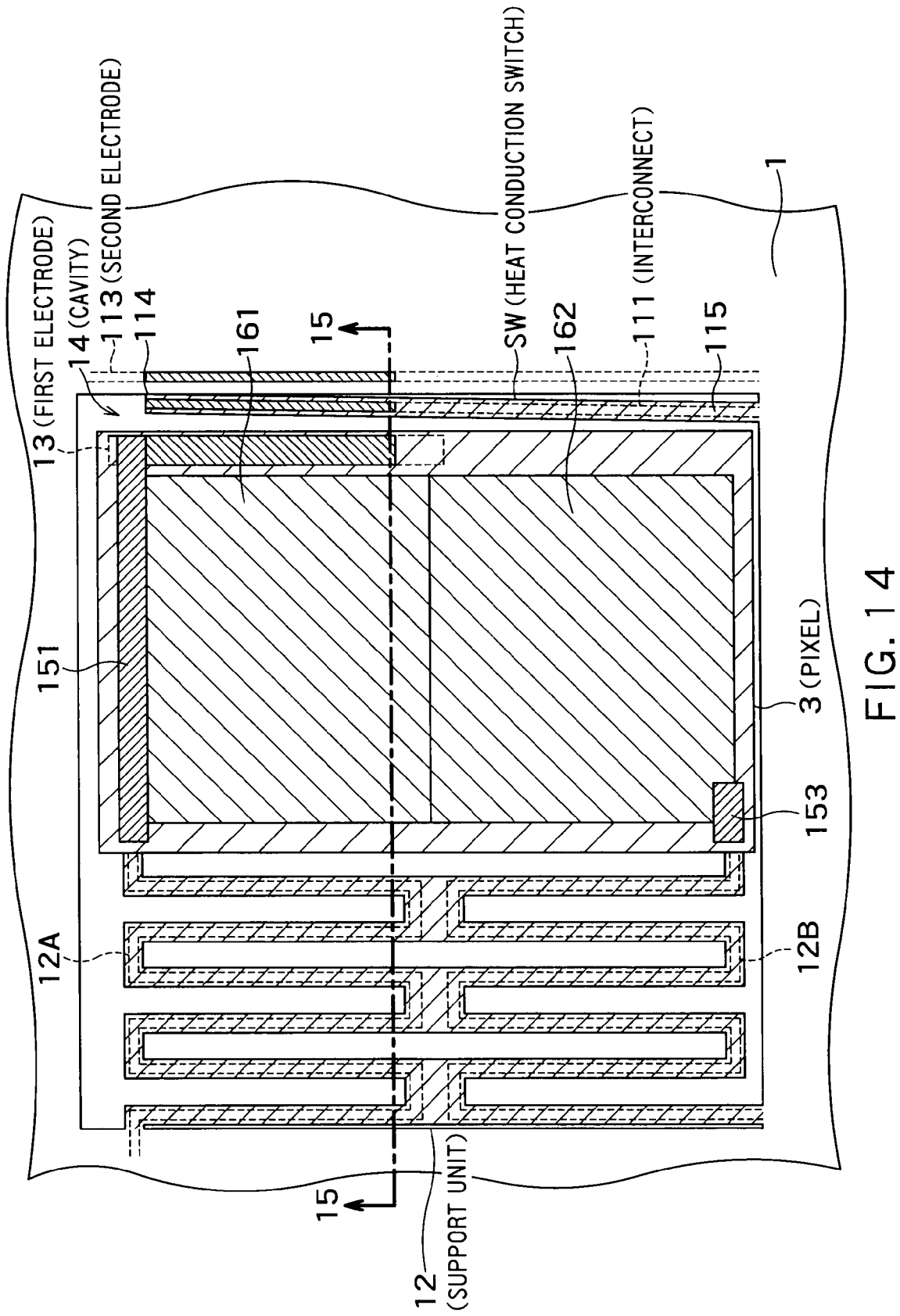
FIG. 14 is a plane view of the pixel 3 according to a fourth embodiment.

To mechanically deform the heat conduction switch SW, a root 115 of the heat conduction switch SW is preferably structured so that the polysilicon layer 111a of a single layer structure is covered with a silicon oxide film. In the fourth embodiment, as shown in FIG. 14, a stacked portion 114 is assumed as a tip end of the heat conduction switch SW. Each of the first electrode 13 and the second electrode 113 includes a stacked structure long in the vertical direction to the surface of the silicon substrate 1 in a portion opposed to the stacked portion 114 of the heat conduction switch SW. It is thereby possible to increase an area S by which the heat conduction switch SW is opposed to the first electrode 13 and an area S by which the heat conduction switch SW is opposed to the second electrode 113.

If a thickness of the stacked portion 114 is, for example, three times as large as that of the single layer portion, i.e., the silicon layer 111a (that is, if the area S by which the stacked portion 114 is opposed to each of the first electrode 13 and the second electrode 14 is three times as large as that of the single layer portion), a force F3 acting on the stacked portion 114 per unit length is represented by the following Equation (8)

$$F3 = (1/2) * \in * (Vsw/d) * 2 \cdot 3S \quad \text{(Equation 8)}$$

The force F3 is three times as high as that acting on the heat conduction switch SW constituted only by the polysilicon layer. In this manner, the heat conduction switch SW according to the fourth embodiment can be driven at lower voltage by increasing the area of the portion of the heat conduction switch SW on which portion the electrostatic force acts.

The fourth embodiment can be combined with any of the first to third embodiments. By such combinations, further, the fourth embodiment can obtain effects of the first to third embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid-state imaging device comprising:
a semiconductor substrate;
a pixel converting a heat energy generated by an incident light into an electric signal, the pixel being supported on a cavity formed in the semiconductor substrate and being thermally separated from the semiconductor substrate;
a heat conduction switch having one end connected to the semiconductor substrate and other end selectively contacting to the semiconductor substrate or the pixel, the heat conduction switch changing over a state of the pixel to one of a first state and a second state, the first state being a state in which the pixel is thermally isolated from the semiconductor substrate by causing the other end of the heat conduction switch to contact with the semiconductor substrate, the second state being a state in which the pixel is thermally shorted to the semiconductor substrate by causing the other end of the heat conduction switch to contact with the pixel; and
a signal detector detecting a difference between the signal voltage of the pixel in the first state and the signal voltage of the pixel in the second state.

2. The device according to claim 1 further comprising:
a signal line transmitting a signal voltage output from the pixel, wherein
the signal detector includes:
a first node;
a coupling capacitor capacitively coupling the first node to the signal line;
a clamping transistor connected between the first node and a clamping voltage source supplying a constant voltage;
a storage capacitor connected between the first node and a ground potential and holding a reference potential; and
an output portion outputting a second voltage from the first node.

3. The device according to claim 2, wherein the heat conduction switch is formed on a same layer as a layer on which the pixel is formed, and is a cantilever adjacent to the pixel.

4. The device according to claim 2, further comprising a support portion supporting the pixel and electrically connecting the pixel to the semiconductor substrate, wherein
the heat conduction switch is formed on a same layer as a layer on which the support portion is formed, and is a cantilever adjacent to the pixel.

5. The device according to claim 2, wherein
the pixel includes a first electrode in a portion in contact with the heat conduction switch,
the semiconductor substrate includes a second electrode in a portion in contact with the heat conduction switch, and
the heat conduction switch changes over the state of the pixel to the first state or the second state according to potentials of the first electrode and the second electrode.

6. The device according to claim 2, further comprising:
an imaging region in which a plurality of the pixels is arranged in a matrix;
a column selection line connected to the pixels arranged in a row direction; and
a vertical scanner applying a voltage to the pixels via a row selection line, wherein
plural signal lines corresponding to respective columns, each signal line connected to the pixels arranged in the respective column, and
the signal detector is provided to correspond to each of the columns, and detects a voltage.

7. The device according to claim 1, wherein the heat conduction switch is formed on a same layer as a layer on which the pixel is formed, and is a cantilever adjacent to the pixel.

8. The device according to claim 1, further comprising a support portion supporting the pixel and electrically connecting the pixel to the semiconductor substrate, wherein
the heat conduction switch is formed on a same layer as a layer on which the support portion is formed, and is a cantilever adjacent to the pixel.

9. The device according to claim 1, wherein
the pixel includes a first electrode in a portion in contact with the heat conduction switch, the semiconductor substrate includes a second electrode in a portion in contact with the heat conduction switch, and the heat conduction switch changes over the state of the pixel to the first state or the second state according to potentials of the first electrode and the second electrode.

10. The device according to claim 1, further comprising:

an imaging region in which a plurality of the pixels is arranged in a matrix;

a column selection line connected to the pixels arranged in a row direction; and a vertical scanner applying a voltage to the pixels via plural row selection lines, wherein plural signal lines corresponding to respective columns, each signal line connected to the pixels arranged in the respective column, and the signal detector is provided to correspond to each of the columns, and detects a voltage.

11. The device according to claim 10, further comprising a horizontal read circuit reading the voltage detected by the signal detector corresponding to each of the columns.

12. The device according to claim 1, wherein the incident light is a light in a terahertz band or in a millimeter-wave band.

13. The device according to claim 1, further comprising:

an antenna receiving an electromagnetic wave and converting the electromagnetic wave into an electric signal; and a resistance element converting the electric signal generated in the antenna into a Joule heat, wherein the pixel generates the electric signal using the Joule heat generated in the resistance element.

14. The device according to claim 1, wherein a tip end of the heat conduction switch has a structure long in a direction vertical to a surface of the semiconductor substrate, and each of the first electrode and the second electrode has a long structure in the direction vertical to the surface of the semiconductor substrate in a portion opposed to the tip end of the heat conduction switch.

15. A method of driving a solid-state imaging device including a semiconductor substrate; a pixel converting a heat energy generated by an incident light into an electric signal, the pixel being supported on a cavity formed in the semiconductor substrate and thermally separated from the semiconductor substrate; a signal line transmitting a signal voltage output from the pixel; a heat conduction switch having one end connected to the semiconductor substrate and other end selectively contacting to the semiconductor substrate or the pixel; and a signal detector capacitively coupled to the signal line, the method comprising:

detecting a difference between the signal voltage of the pixel in a first state and the signal voltage of the pixel in a second state, the first state being a state in which the pixel is thermally isolated from the semiconductor substrate by causing the other end of the heat conduction switch to contact with the semiconductor substrate, the second state being a state in which the pixel is thermally shorted to the semiconductor substrate by causing the other end of the heat conduction switch to contact with the pixel.

16. The method according to claim 15, further comprising:

holding a first voltage in the signal detector, the first voltage being a voltage according to a signal on the signal line in the first state; and detecting a second voltage in the signal detector, the second voltage being a voltage obtained by adding at least a voltage component corresponding to the incident light to the first voltage or a voltage obtained by subtracting at least the voltage component corresponding to the incident light from the first voltage in the second state.

17. The method according to claim 16, further comprising:

applying a pulse voltage from a vertical scanner to one of the first electrode, the second electrode, and the heat conduction switch.

18. The method according to claim 15, further comprising:

applying a pulse voltage from a vertical scanner to one of the first electrode, the second electrode, and the heat conduction switch.

* * * * *